(12) United States Patent
Kim et al.

(10) Patent No.: US 12,279,506 B2
(45) Date of Patent: Apr. 15, 2025

(54) ORGANIC LIGHT EMITTING DISPLAY DEVICE

(71) Applicant: SAMSUNG DISPLAY CO., LTD., Yongin-si (KR)

(72) Inventors: Kwangmin Kim, Yongin-si (KR); Wonkyu Kwak, Yongin-si (KR); Kiwook Kim, Yongin-si (KR); Dongsoo Kim, Yongin-si (KR); Joongsoo Moon, Yongin-si (KR); Hyunae Park, Yongin-si (KR); Jieun Lee, Yongin-si (KR); Changkyu Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/543,797

(22) Filed: Dec. 18, 2023

(65) Prior Publication Data

US 2024/0122027 A1    Apr. 11, 2024

Related U.S. Application Data

(63) Continuation of application No. 17/816,585, filed on Aug. 1, 2022, now Pat. No. 11,849,621, which is a
(Continued)

(30) Foreign Application Priority Data

Mar. 30, 2017    (KR) .......................... 10-2017-0041060

(51) Int. Cl.
*G06F 3/041*    (2006.01)
*G06F 3/044*    (2006.01)
(Continued)

(52) U.S. Cl.
CPC ........... *H10K 59/40* (2023.02); *G06F 3/0412* (2013.01); *G06F 3/0443* (2019.05);
(Continued)

(58) Field of Classification Search
CPC .... H10K 59/40; H10K 50/131; H10K 50/805; H10K 50/8428; H10K 59/122;
(Continued)

(56) References Cited

U.S. PATENT DOCUMENTS 7,274,424 B1    9/2007    Kurihara et al.
8,994,015 B2    3/2015    Pyon et al.
(Continued)

FOREIGN PATENT DOCUMENTS

CN    101419373    3/2012
CN    104393021    3/2015
(Continued)

OTHER PUBLICATIONS

Decision on Registration dated Sep. 25, 2021, issued in the corresponding Korean Patent Application No. 10-2017-0041060.
(Continued)

*Primary Examiner* — Bryan Earles
(74) *Attorney, Agent, or Firm* — F. Chau & Associates, LLC

(57) ABSTRACT

An organic light emitting display device includes: a substrate including pixel areas and a pixel separating area; a plurality of pixels; a plurality of spacers in the pixel separating area and spaced apart from each other; and a touch electrode unit disposed over the plurality of pixels and spacers. The touch electrode unit includes first touch electrodes arranged in a first direction and second touch electrodes arranged in a second direction. The touch electrode unit includes a plurality of touch pattern unit blocks repeatedly arranged. Each touch pattern unit block includes portions of each of neighboring first touch electrodes and portions of each of neighboring second touch electrodes. The spacers of each touch pattern unit block corresponds to a plurality of spacer pattern unit blocks repeatedly arranged.
(Continued)

Each spacer pattern unit includes at least one spacer and is smaller than the touch pattern unit block.

20 Claims, 11 Drawing Sheets

Related U.S. Application Data continuation of application No. 16/907,688, filed on Jun. 22, 2020, now Pat. No. 11,404,497, which is a continuation of application No. 15/833,265, filed on Dec. 6, 2017, now Pat. No. 10,692,942.

(51) Int. Cl.
| | | |
|---|---|---|
| *H01L 27/32* | (2006.01) | |
| *H10K 50/13* | (2023.01) | |
| *H10K 50/805* | (2023.01) | |
| *H10K 50/842* | (2023.01) | |
| *H10K 59/122* | (2023.01) | |
| *H10K 59/40* | (2023.01) | |

(52) U.S. Cl.
CPC ......... *G06F 3/0446* (2019.05); *H10K 50/131* (2023.02); *H10K 50/805* (2023.02); *H10K 50/8428* (2023.02); *H10K 59/122* (2023.02); *G06F 2203/04111* (2013.01); *G06F 2203/04112* (2013.01)

(58) Field of Classification Search
CPC ...... H10K 59/121; H10K 59/38; H10K 59/12; H10K 59/131; G06F 3/0412; G06F 3/0443; G06F 3/0446; G06F 2203/04111; G06F 2203/04112; G06F 3/041
See application file for complete search history.

(56) References Cited

U.S. PATENT DOCUMENTS

| | | | |
|---|---|---|---|
| 9,129,927 B2 | 9/2015 | Gupta et al. | |
| 9,202,408 B2 | 12/2015 | Choi et al. | |
| 9,343,513 B2 | 5/2016 | Ito | |
| 9,508,778 B2 | 11/2016 | Kim et al. | |
| 9,612,443 B2 | 4/2017 | Koito et al. | |
| 9,704,926 B2 | 7/2017 | Kim | |
| 10,222,896 B2 | 3/2019 | Liu et al. | |
| 10,411,076 B2 | 9/2019 | Kajiyama | |
| 10,692,942 B2 | 6/2020 | Kim et al. | |
| 11,393,937 B2 * | 7/2022 | Huang | H01L 27/14603 |
| 11,404,497 B2 | 8/2022 | Kim et al. | |
| 2009/0180043 A1 | 7/2009 | Rho et al. | |
| 2013/0154977 A1 | 6/2013 | Lee et al. | |
| 2015/0053935 A1 | 2/2015 | Gupta et al. | |
| 2015/0220191 A1 | 8/2015 | Huh et al. | |
| 2016/0117031 A1 | 4/2016 | Han et al. | |
| 2017/0153752 A1 | 6/2017 | Kurasawa et al. | |
| 2017/0262121 A1 | 9/2017 | Kurasawa et al. | |
| 2018/0122867 A1 | 5/2018 | Choe et al. | |
| 2018/0151637 A1 | 5/2018 | Kajiyama | |
| 2018/0286925 A1 | 10/2018 | Kim et al. | |
| 2020/0321404 A1 | 10/2020 | Kim et al. | |
| 2022/0384532 A1 | 12/2022 | Kim et al. | |

FOREIGN PATENT DOCUMENTS

| | | |
|---|---|---|
| JP | 2012-198879 | 10/2012 |
| JP | 2014-49438 | 3/2014 |
| KR | 10-2014-0096905 | 8/2014 |
| KR | 10-1427593 | 8/2014 |
| KR | 10-2015-0067624 | 6/2015 |
| KR | 10-2015-0124360 | 11/2015 |
| KR | 10-2016-0104804 | 9/2016 |
| WO | 2012121064 | 9/2012 |

OTHER PUBLICATIONS

First Examination Report dated Jan. 10, 2022, issued in corresponding Indian Patent Application No. 201814011120.
Notice of Allowance dated Nov. 9, 2021 in corresponding U.S. Appl. No. 16/907,688.
U.S. Office Action dated Nov. 7, 2019 in corresponding U.S. Appl. No. 15/833,265.
Office Action dated Mar. 2, 2023 in corresponding U.S. Appl. No. 17/816,585.

* cited by examiner

ORGANIC LIGHT EMITTING DISPLAY DEVICE

CROSS-REFERENCE TO RELATED APPLICATION

This application is a continuation of U.S. patent application Ser. No. 17/816,585 filed Aug. 1, 2022, which is a continuation U.S. patent application Ser. No. 16/907,688 filed Sep. 22, 2020, issued as U.S. Pat. No. 11,404,497 on Aug. 2, 2022 which is a continuation application of U.S. patent application Ser. No. 15/833,265 filed Dec. 6, 2017, issued as U.S. Pat. No. 10,692,942 on Jun. 23, 2020, which claims priority to and the benefit of Korean Patent Application No. 10-2017-0041060, filed on Mar. 30, 2017, in the Korean Intellectual Property Office, the disclosures of which are incorporated by reference in their entirety herein.

BACKGROUND

1. Technical Field

One or more exemplary embodiments of the inventive concept relate to an organic light emitting display device.

2. Discussion of the Related Art

An organic light emitting display device may include an organic light-emitting diode (OLED). An OLED is a light emitting diode in which the emissive electroluminescent layer is a film of an organic compound that emits light in response to an electric current. When the organic light emitting display device is implemented in a portable manner, the display device may include a touch function. For example, the display device may be configured to sense the location of a finger or a stylus of a user contacting a surface thereof.

The organic light emitting display device may include touch electrodes to support the touch function. An inspection may be performed to verify whether a defect is present in the touch electrodes. The inspection may include analyzing images of the touch electrodes captured by a camera.

SUMMARY

According to an exemplary embodiment of the inventive concept, there is provided an organic light emitting display device including: a substrate including a plurality of pixel areas and a pixel separating area between the pixel areas; a plurality of pixels corresponding to each of the plurality of pixel areas, each of the pixels including a pixel electrode, an opposite electrode, and an organic light emitting layer disposed between the pixel electrode and the opposite electrode; a plurality of spacers disposed in the pixel separating area and spaced apart from each other; and a touch electrode unit disposed over the plurality of pixels and the plurality of spacers. The touch electrode unit includes first touch electrodes arranged in a first direction and second touch electrodes arranged in a second direction substantially perpendicular to the first direction. The touch electrode unit includes a plurality of touch pattern unit blocks repeatedly arranged and each touch pattern unit block includes portions of each of neighboring first touch electrodes and portions of each of neighboring second touch electrodes. An arrangement of the spacers of each touch pattern unit block corresponds to a plurality of spacer pattern unit blocks repeatedly arranged and each spacer pattern unit includes at least one spacer and is smaller than the touch pattern unit block.

According to an embodiment, the plurality of pixels include a plurality of pixel pattern unit blocks repeatedly arranged, and each pixel pattern unit block includes at least a first pixel, a second pixel, and a third pixel, and the first pixel, the second pixel, and the third pixel emit light corresponding to different colors.

According to an embodiment, an arrangement of the pixels of each spacer pattern unit block corresponds to K of the pixel pattern unit blocks arranged in the first direction, and L of the pixel pattern unit blocks arranged in the second direction, where K and L are natural numbers.

According to an embodiment, an arrangement of the pixels of each touch pattern unit block corresponds to M of the pixel pattern unit blocks are arranged in the first direction, and N of the pixel pattern unit blocks arranged in the second direction, where M is a natural number and an integer multiple of the K, and N is a natural number and an integer multiple of the L.

According to an embodiment, in each pixel pattern unit block, the number of the third pixels is equal to a sum of the number of the first pixels and the number of the second pixels.

According to an embodiment, the at least one spacer is located at an intersection of a first virtual line connecting neighboring first pixels and second pixels, and a second virtual line connecting neighboring third pixels.

According to an embodiment, the at least one spacer includes a first spacer adjacent to a corner of each spacer pattern unit block.

According to an embodiment, each spacer pattern unit block further includes a second spacer separated apart from the first spacer in a third direction that forms an acute angle with respect to the first direction and the second direction.

According to an embodiment, each touch pattern unit block has a square shape.

According to an embodiment, each spacer pattern unit block has a square shape.

According to an exemplary embodiment of the inventive concept, provided is an organic light emitting display device including: a plurality of pixels, each pixel including a pixel electrode, an opposite electrode, and an organic light emitting layer between the pixel electrode and a opposite electrode; a plurality of spacers disposed between neighboring pixels and spaced apart from each other; and a touch electrode unit disposed over the plurality of pixels and the plurality of spacers. The touch electrode unit includes first touch electrodes arranged in a first direction and second touch electrodes arranged in a second direction perpendicular to the first direction. The touch electrode unit includes a plurality of touch pattern unit blocks repeatedly arranged and each touch pattern unit block includes portions of each of neighboring first touch electrodes and portions of each of neighboring second touch electrodes. The plurality of spacers includes a plurality of spacer pattern unit blocks repeatedly arranged and each spacer pattern unit block includes at least one spacer and is smaller than the touch pattern unit block.

According to an embodiment, each of the first touch electrodes and each of the second touch electrodes include wires of a net structure at least partially surrounding each of the plurality of pixels.

According to an embodiment, the plurality of spacers overlap the wires of the first touch electrodes or the wires of the second touch electrodes.

According to an embodiment, an arrangement of the spacers corresponding to each touch pattern unit block correspond to the arrangement of the spacers according to an A×B array of the spacer pattern unit blocks, where A and B are natural numbers.

According to an embodiment, the plurality of pixels include a plurality of pixel pattern unit blocks repeatedly arranged, each pixel pattern unit block includes at least three pixels that emit light corresponding to different colors, and the arrangement of pixels of each spacer pattern unit block corresponds to K of the pixel pattern unit blocks arranged in the first direction or in the second direction, where K is a natural number.

According to an embodiment, the plurality of pixels include a plurality of pixel pattern unit blocks repeatedly arranged, each pixel pattern unit block includes at least three pixels that emit light corresponding to different colors, and the arrangement of the pixels of each touch pattern unit block corresponds to M of the pixel pattern unit blocks arranged in the first direction or in the second direction, where M is a natural number.

In this embodiment, the plurality of pixels include a first pixel, a second pixel, and a third pixel that emit light corresponding to different colors, and the at least one spacer is located at an intersection of a first virtual line connecting neighboring first pixels and second pixels, and a second virtual line connecting neighboring third pixels.

According to an embodiment, the at least one spacer includes a first spacer adjacent to one corner of each spacer pattern unit block.

According to an embodiment, each spacer pattern unit block further includes a second spacer spaced apart from the first spacer in a third direction crossing the first direction and the second direction.

According to an embodiment, each touch pattern unit block and each spacer pattern unit block have a square shape.

According to an exemplary embodiment of the inventive concept, an organic light emitting display device includes a substrate including a plurality of pixel areas and a pixel separating area between the pixel areas; a plurality of pixels corresponding to each of the plurality of pixel areas, each of the pixels including a pixel electrode, an opposite electrode, and an organic light emitting layer located between the pixel electrode and the opposite electrode; a plurality of spacers disposed in the pixel separating area and spaced apart from each other; and a touch electrode layer disposed over the plurality of pixels and the plurality of spacers. The touch electrode layer includes first touch electrodes and second touch electrodes arranged in a first direction, third touch electrodes and fourth touch electrodes arranged in a second other direction, a first connection line connecting the first and second touch electrodes together, and a second connection line connecting the third and fourth touch electrodes together, where the first direction is perpendicular to the second direction.

In an embodiment, a first spacer among the spacers is adjacently disposed between a first pixel, a second pixel, a third pixel, and a fourth pixel among the pixels, the first pixel emitting a first color, the second pixel emitting a second color, and the third and fourth pixels emitting a third color.

In an embodiment, wherein the first and second pixels are arranged on the first direction and the third and fourth pixels are arranged in the second direction.

BRIEF DESCRIPTION OF THE DRAWINGS

The inventive concept will become apparent and more readily appreciated from the following description of the embodiments thereof, taken in conjunction with the accompanying drawings in which.

DETAILED DESCRIPTION

Figure 1:
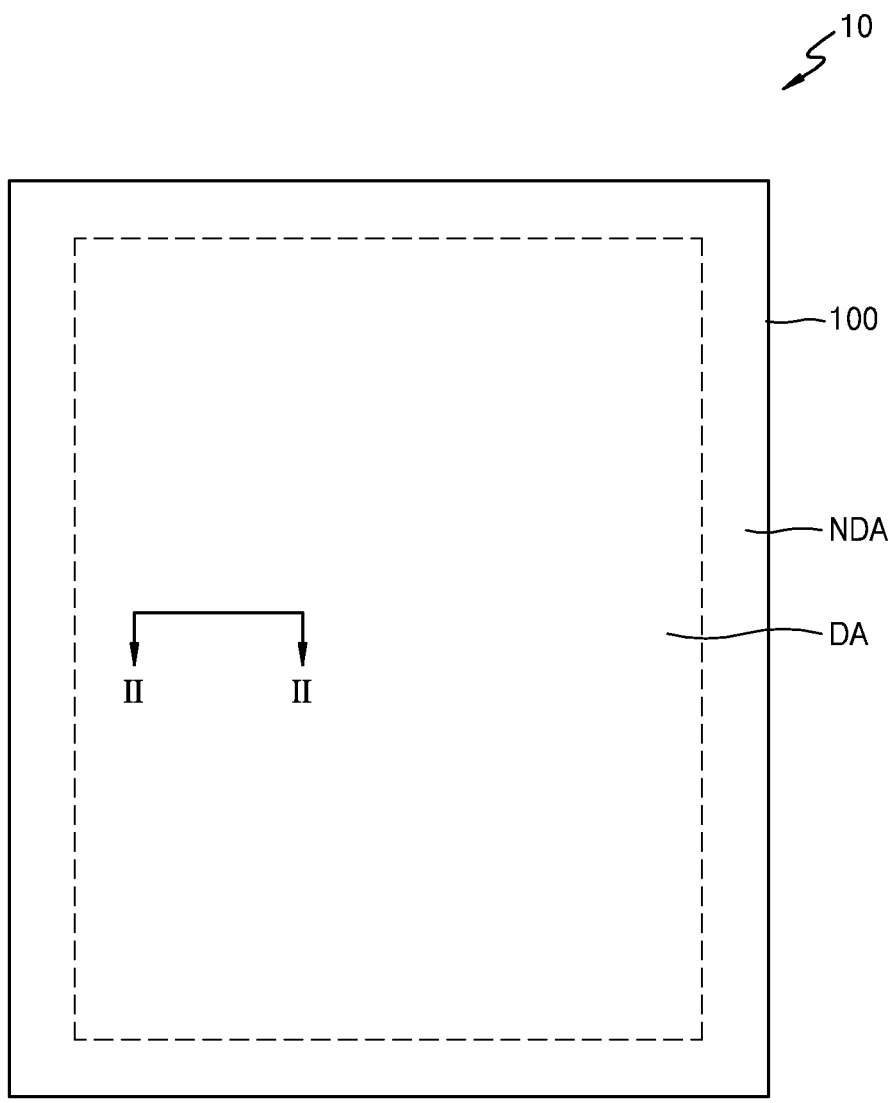
FIG. 1 is a plan view of an organic light emitting display device according to an exemplary embodiment of the present inventive concept.

As the inventive concept allows for various changes and numerous embodiments, exemplary embodiments will be illustrated in the drawings and described in detail in the written description. Effects and features of the present disclosure and methods of achieving them will be apparent with reference to the embodiments described below in detail with reference to the drawings. However, the present disclosure is not limited to the embodiments described below, but may be implemented in various forms.

Hereinafter, exemplary embodiments of the present inventive concept will be described in detail with reference to the accompanying drawings, wherein like reference numerals refer to like or corresponding components throughout the drawings and a duplicate description thereof will be omitted.

As used herein, the singular forms "a," "an" and "the" are intended to include the plural forms as well, unless the context clearly indicates otherwise.

When a certain embodiment may be implemented differently, a specific process order may be performed differently from the described order. For example, two consecutively described processes may be performed substantially at the same time or performed in an order opposite to the described order.

Figure 2:
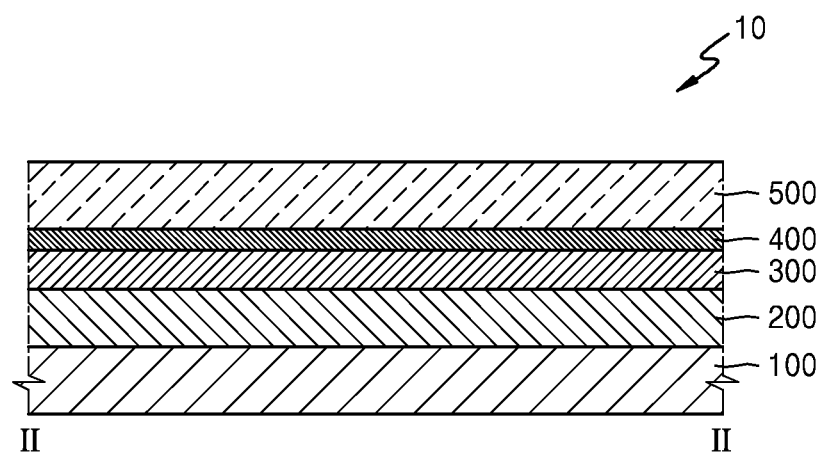
FIG. 2 is a sectional view taken along the line II-II in FIG. 1.

FIG. 1 is a plan view of an organic light emitting display device 10 according to an exemplary embodiment of the present inventive concept. FIG. 2 is a sectional view taken along the line II-II in FIG. 1.

Referring to FIG. 1, the organic light emitting display device 10 includes a display area DA and a non-display area NDA. In the display area DA, pixels including display elements such as organic light emitting diodes (OLEDs) may be arranged to provide a certain image. The non-display area NDA is an area which does not provide an image and surrounds the display area DA. In the non-display area NDA, a scan driver and a data driver which provide electrical signals to be applied to the pixels in the display area DA, and power lines providing power such as a driving voltage and a common voltage may be arranged. The scan driver may apply gate signals to gate lines connected to the pixels and the data driver may provide data signals to data lines connected to the pixels.

As illustrated in FIG. 2, the organic light emitting display device 10 includes a display unit 200 forming the display area DA on a substrate 100. The substrate 100 may include various materials such as glass, metal, or plastic such as polyethylene terephthalate (PET), polyethylenenaphthalate (PEN), and polyimide. The display unit 200 may include pixels including OLEDs that are configured to provide a certain image. In an embodiment, the display unit 200 is covered by a sealing member 300.

The sealing member 300 may face the substrate 100 with the display unit 200 therebetween and protect the display unit 200 from external moisture or oxygen, or the like. In an embodiment, a touch electrode unit 400 is located on the sealing member 300.

The touch electrode unit 400 may include a plurality of touch electrodes having conductivity. For example, the touch electrode unit 400 may be of a capacitive type. In an embodiment, the touch electrode unit 400 outputs coordinates of a location at which an object approaches or touches, by using a change in capacitance occurring when the object such as a user's finger or a stylus approaches or touches a surface of the touch electrode unit 400.

In an embodiment of the inventive concept, an optical functional layer 500 is located on the touch electrode unit 400. In an embodiment of the inventive concept, the optical function layer 500 includes a polarizing plate or a polarizer. In an embodiment, the polarizer is an optical filter that lets light waves of a specific polarization pass and blocks lights waves of other polarizations. In another exemplary embodiment, the optical function layer 500 includes a layer including a black matrix and a color filter. In an embodiment, the black matrix prevents light from passing therethrough. According to another exemplary embodiment, the optical functional layer 500 includes a window member. In an embodiment, the window member is transparent.

Figure 3:
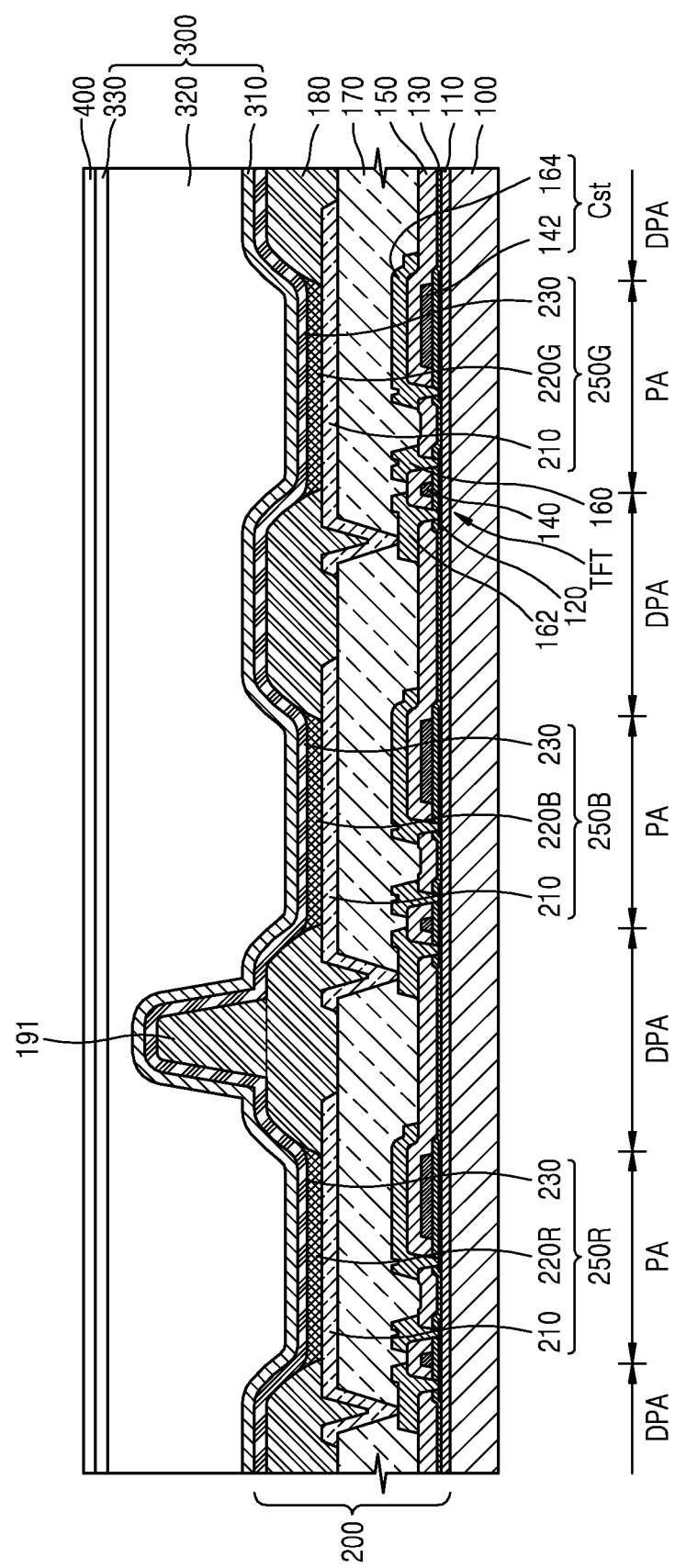
FIG. 3 is a cross-sectional view of a display unit, a sealing member, and a touch electrode unit formed on the substrate of FIG. 2 according to an exemplary embodiment of the present inventive concept.

FIG. 3 is a cross-sectional view of the display unit 200, the sealing member 300, and the touch electrode unit 400 formed on the substrate 100 of FIG. 2 according to an exemplary embodiment of the present inventive concept.

Referring to FIG. 3, the display unit 200 is located on the substrate 100. The display unit 200 includes OLEDs 250R, 250B, and 250G provided for each pixel. The OLEDs 250R, 250B, and 250G may be electrically connected to their respective thin film transistors (TFTs) and storage capacitor (Cst).

In an embodiment, the TFT includes a semiconductor layer 120, a gate electrode 140 overlapping a portion (channel area) of the semiconductor layer 120, and a source electrode 160 and a drain electrode 162 connected to the semiconductor layer 120. The semiconductor layer 120 may include an inorganic semiconductor such as silicon, or an organic semiconductor or an oxide semiconductor material. The semiconductor layer 120 may include a source area, a drain area, and a channel area located between the source area and the drain area. According to an embodiment, an amorphous silicon layer is formed on the substrate 100, and is crystalized to be a polycrystalline silicon layer, and patterned. In an embodiment, a portion of the polycrystalline silicon layer which does not overlap the gate electrode 140 is doped with impurities by using a self-aligning mask on the gate electrode 140. As a result, the semiconductor layer 120 including the source area, the drain area, and the channel area therebetween may be formed. The gate electrode 140 may have a single layer or a multi-layer including at least one of Al, Pt, Pd, Ag, Mg, Au, Ni, Nd, Ir, Cr, Li, Ca, Mo, Ti, and/or W.

A buffer layer 110 for preventing infiltration of impurities may be located between the semiconductor layer 120 and the substrate 100. A gate insulating layer 130 may be located between the semiconductor layer 120 and the gate electrode 140. An interlayer insulating layer 150 may be located on the gate electrode 140. The buffer layer 110 may include an inorganic material such as silicon oxide ($SiO_x$), silicon nitride ($SiN_x$), silicon oxynitride (SiON), aluminum oxide ($Al_2O_3$), aluminum nitride (AlN), titanium oxide ($TiO_2$), or titanium nitride (TiN). The gate insulating layer 130 may include a material such as SiNx or $SiO_x$, and the interlayer insulating layer 150 may be a single layer or a multi-layer including a material such as $SiN_x$, $SiO_x$, or SiON.

The source electrode 160 and the drain electrode 162 may be located on the interlayer insulating layer 150 and be connected to the source area and the drain area of the semiconductor layer 120, respectively. According to an embodiment, the source area and the drain area of the semiconductor layer 120 may be referred to as a source electrode and a drain electrode, respectively. The source electrode 160 and the drain electrode 162 may have a single layer or a multi-layer including at least one of Al, Pt, Pd, Ag, Mg, Au, Ni, Nd, Ir, Cr, Li, Ca, Mo, Ti, and/or W.

The storage capacitor Cst includes a bottom electrode 142 and a top electrode 164. The bottom electrode 142 (e.g., a lower electrode) may include the same material as the gate electrode 140, and the upper electrode 164 may include the same material as the source electrode 160 or the drain electrode 162. However, the inventive concept is not limited thereto.

The thin film transistor TFT and the storage capacitor Cst may be covered by a planarization insulating layer 170. The planarization insulating layer 170 may include $SiO_2$, $SiN_x$, SiON, $Al_2O_3$, $TiO_2$, $Ta_2O_5$, $HfO_2$, $ZrO_2$, BST, or PZT. Alternatively, the planarization insulating layer 170 may include an organic insulating material such as a general purpose polymer (PMMA or PS), a polymer derivative having a phenolic group, an acrylic polymer, an imide polymer, an arylether polymer, an amide polymer, a fluorine polymer, a p-xylene polymer, a vinyl alcohol-based polymer, and blends thereof. Alternatively, the planarization insulating layer 170 may include both the above-mentioned inorganic insulating material and organic insulating material.

The organic light emitting devices 250R, 250B, and 250G corresponding to respective pixels may be located on the planarization insulating layer 170. Each of the organic light emitting devices 250R, 250B, and 250G may be electrically connected to the thin film transistor TFT via contact holes defined in the planarization insulating layer 170. The organic light emitting devices 250R, 250B, and 250G emit red color light, blue color light, and green color light, respectively.

The red color organic light emitting device 250R includes a pixel electrode 210, an organic light emitting layer 220R emitting red color light, and an opposite electrode 230, and may correspond to a first pixel emitting red color light. The blue color organic light emitting device 250B includes the pixel electrode 210, an organic light emitting layer 220B emitting blue color light, and the opposite electrode 230, and may correspond to a second pixel emitting blue color light. The green color organic light emitting device 250G include the pixel electrode 210, an organic light emitting layer 220G emitting green color light, and the opposite electrode 230, and may correspond to a third pixel emitting green color light. In this specification, it will be understood that the first, second, and third pixels represent red color, blue color, and green color sub-pixels, respectively.

The pixel electrode 210 may correspond to each pixel area PA and may be a reflective electrode. The pixel electrode 210 may include a reflective film including Ag, Mg, Al, Pt, Pd, Au, Ni, Nd, Ir, Cr, or a compound thereof, and may further include a layer located on the reflective film, including indium tin oxide (ITO), indium zinc oxide (IZO), zinc oxide (ZnO), or indium oxide ($In_2O_3$). For example, the pixel electrode 210 may be a triple layer of ITO/Ag/ITO.

In an embodiment, the pixel defining layer 180 includes an opening exposing a central portion of the pixel electrode 210 to define the pixel (sub-pixel). In addition, an arc or the like may be prevented from occurring at an edge (end) of the pixel electrode 210 by increasing a distance between the edge of the pixel electrode 210 and the opposite electrode 230. The pixel defining layer 180 may include an organic insulating material such as polyimide (PI) or hexamethyldisiloxane (HMDSO).

In an embodiment, a spacer 191 is located on the pixel defining layer 180. For example, the spacer 191 may directly contact the pixel defining layer 180. The spacer 191 may correspond to a pixel separating area DPA located between the pixel areas PA. The spacer 191 may prevent or minimize defects of the organic light emitting layers 220R, 220B and 220G due to sagging of a mask, by supporting the mask to be used in a deposition process of the organic light emitting layers 220R, 220B and 220G to be described below. Alternatively, the spacer 191 may prevent or minimize the Newton-ring phenomenon due to sagging or the like of a sealing substrate, by maintaining a gap between the substrate 100 and the sealing substrate constant, even when external pressure is applied to the sealing member 300 (for example, a rigid sealing substrate).

The spacer 191 may include the same material as the pixel electrode 180. For example, the spacer 191 may include an organic insulating material such as PI or HMDSO. The spacer 191 and the pixel defining layer 180 may be formed together in a same mask process, for example, in a process using a halftone mask.

The red color organic light emitting layer 220R may include a fluorescent material or a phosphorescent material that emits red color visible light, the blue color organic light emitting layer 220B may include a fluorescent material or a phosphorescent material that emits blue color visible light, and the green color organic light emitting layer 220G may include a fluorescent material or a phosphorescent material that emits green color visible light.

In an embodiment, the opposite electrode 230 is a (semi-) transparent electrode. The opposite electrode 230 may be a layer including Ag, Mg, Al, Yb, Ca, Li, Au or a compound thereof, or a layer including a (semi-) transparent material such as ITO, IZO, ZnO or $In_2O_3$. According to an embodiment, the opposite electrode 230 includes a metal thin film including Ag or Mg. The opposite electrode 230 may be integrally formed to entirely cover both the pixel area PA and the pixel separating area DPA.

FIG. 3 illustrates a structure in which the red color, blue color, and green color organic light emitting layers 220R, 220B, and 220G are between the pixel electrode 210 and the opposite electrode 230 in direct contact with them. However, the inventive concept is not limited thereto. According to an exemplary embodiment, the red color, blue color, and green color organic light emitting layers 220R, 220B, and 220G include a first functional layer thereunder and a second functional layer thereon. Each of the first and/or second functional layers, like the opposite electrode 230, may be integrally formed to entirely cover both the pixel area PA and the pixel separating area DPA.

The first functional layer may be a single layer or a multi-layer including a hole injection layer (HIL) and/or a hole transport layer (HTL). For example, when the first functional layer includes a polymer material, the first functional layer may be a single HTL including poly-(3,4)-ethylene-dihydroxythiophene (PEDOT) or polyaniline (PANI). When the first functional layer includes a low molecular weight material, the first functional layer may include the HIL and the HTL.

The second functional layer may include a single layer or a multi-layer including an electron transport layer (ETL) and/or an electron injection layer (EIL). The second functional layer may be omitted. For example, when the first functional layer and the organic light emitting layers 220R, 220B, and 220G include polymer materials, the second functional layer may be omitted. When the first functional layer and the organic light emitting layers 220R, 220G, and 220B include low molecular weight materials, the second functional layer may be additionally formed for improving the characteristics of an organic light emitting device. In this case, the second functional layer may include the ETL and/or the EIL.

The sealing member 300 may include at least one inorganic layer and at least one organic layer. In an embodiment, the sealing member 300 includes a first inorganic layer 310, a second inorganic layer 330, and an organic layer 320 located between the first inorganic layer 310 and the second inorganic layer 330. The first and second inorganic layers 310 and 330 may include $SiO_x$, $SiN_x$, or SiON. The organic layer 320 may include at least one of polyethylene terephthalate, polyethylene naphthalate, polycarbonate, polyimide, polyethylene sulfonate, polyoxymethylene, polyarylate, and/or hexamethyldisiloxane. Although not illustrated, other layers such as a capping layer may be located between the first inorganic layer 310 and the opposite electrode 230 as needed. A case is described in which the sealing member 300 includes the first inorganic layer 310, the organic layer 320, and the second inorganic layer 330 which are sequentially stacked, according to an embodiment. However, the number of stacking times may be changed such that inorganic layers and organic layers are alternately stacked. According to an embodiment, a case is described in which the sealing member 300 is a thin film sealing film including alternately stacked inorganic layers and organic layers. However, according to another embodiment, the sealing member 300 may be a rigid translucent sealing substrate.

In an embodiment, the touch electrode unit 400 is located on the sealing member 300 and generates location information in accordance with a touch input. A structure of the touch electrode unit 400 will be described below with reference to FIGS. 4 and 5.

Figure 4:
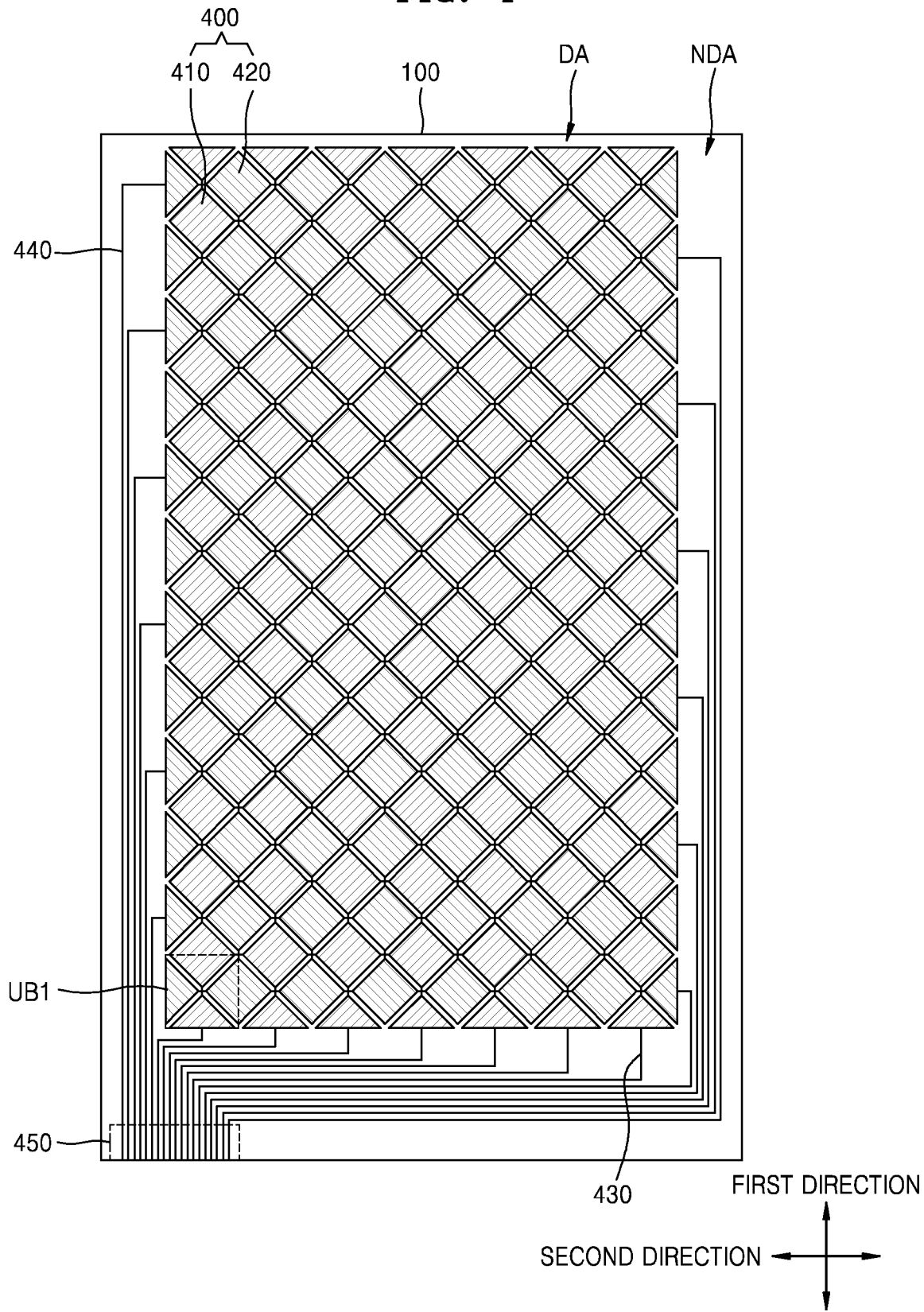
FIG. 4 is a plan view of the touch electrode unit disposed over the substrate.
Figure 5:
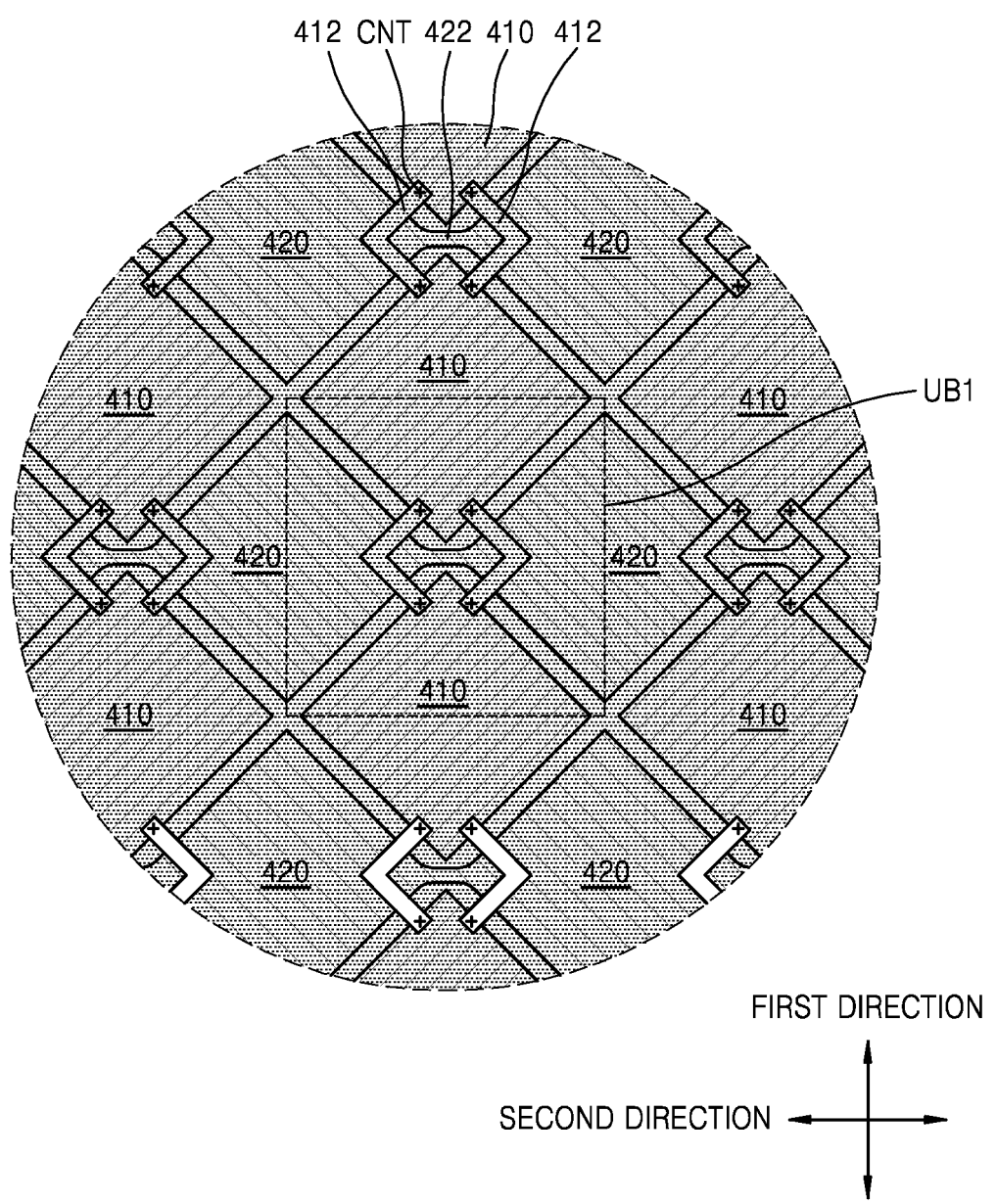
FIG. 5 is an enlarged plan view of a portion of FIG. 4.

FIG. 4 is a plan view of the touch electrode unit 400 over the substrate 100. FIG. 5 is an enlarged plan view of an excerpt of a portion of FIG. 4.

Referring to FIG. 4, the touch electrode unit 400 (e.g., a touch electrode layer) includes first touch electrodes 410 arranged in a first direction and second touch electrodes 420 arranged in a second direction crossing (e.g. perpendicular to) the first direction.

The first touch electrodes 410 and the second touch electrodes 420 may be alternately arranged with each other. For example, the first touch electrodes 410 may be arranged in parallel with each other, with corners thereof meeting each other, in the first direction, and the second touch electrodes 420 may be arranged in parallel with each other between the first touch electrodes 410, with corners thereof meeting each other, in the second direction.

In an embodiment, the first touch electrodes 410 arranged in the first direction are electrically connected to each other, and the second touch electrodes 420 arranged in the second direction are electrically connected to each other. For example, as illustrated in FIG. 5, the first touch electrodes 410 may be electrically connected to each other via a first connection line 412, and the second touch electrodes 420 may be electrically connected to each other via a second connection line 422.

The first and second touch electrodes 410 and 420 may be located on the same layer and include the same materials. The second connection line 422 connecting the neighboring second touch electrodes 420 may be located on the same layer as the second touch electrodes 420 and include the same material as the second touch electrodes 420. In an embodiment, the second touch electrodes 420 and the second connection line 422 are integrally formed, and the first touch electrodes 410 are electrically connected to each other via the first connection line 412 thereon with an insulating layer (not illustrated) therebetween. In an embodiment, an insulating layer is located between a first connection line 412 and an overlapping second connection line 422 to prevent them from contacting one another. The first connection line 412 may be connected to respective first touch electrodes 410 via contact holes CNT penetrating the insulating layer. The first and second touch electrodes 410 and 420, and the first and second connection lines 412 and 422 may include a transparent conductive layer such as ITO, IZO, or ZnO, or may include a (semi-)transparent metal layer.

In an embodiment, columns of the first touch electrodes 410 in the first direction and rows of the second touch electrodes 420 in the second direction are respectively connected to sensing lines 430 and 440, as illustrated in FIG. 4. Signals obtained via the sensing lines 430 and 440 may be provided via a pad 450 to a circuit unit (not illustrated) including a location detection circuit. The location detection circuit may analyze voltages on the sensing lines 430 and 440 to detect the location at which a user touched the touch electrode unit 400. In an embodiment, the touch electrodes 410 and 420 are capacitive sensors.

The touch electrode unit 400 may be formed in a repetitive arrangement of certain touch pattern unit blocks UB1, as illustrated in FIGS. 4 and 5. The touch pattern unit block UB1 may be a virtual unit block having a certain area including at least portions of neighboring first touch electrodes 410 and at least portions of neighboring second touch electrodes 420, and may be understood as a minimum repetitive unit of array patterns of the first and second touch electrodes 410 and 420. Alternatively, the touch pattern unit block UB1 may be understood as a minimum unit of image capturing for defect inspection of the touch electrode unit 400. The defect of the touch electrode unit 400 may be detected by capturing the image corresponding to the touch pattern unit block UB1 for each area and comparing images. In this case, the minimum unit of image capture for defect inspection may correspond to the touch pattern unit block UB1.

In an embodiment, a shape of the touch pattern unit block UB1 is a quadrangle, for example, a square. For example, the touch pattern unit block UB1 may be a square having a length of less than about 5 mm in the first and second directions. When the touch electrode unit 400 is formed in the repetitive arrangement of square touch pattern unit blocks UB1 having a certain area while including a portion of the first touch electrodes 410 and a portion of the second touch electrodes 420, the location detection may be executed at a relatively fast response speed and the accuracy of the location detection may be improved.

Figure 6:
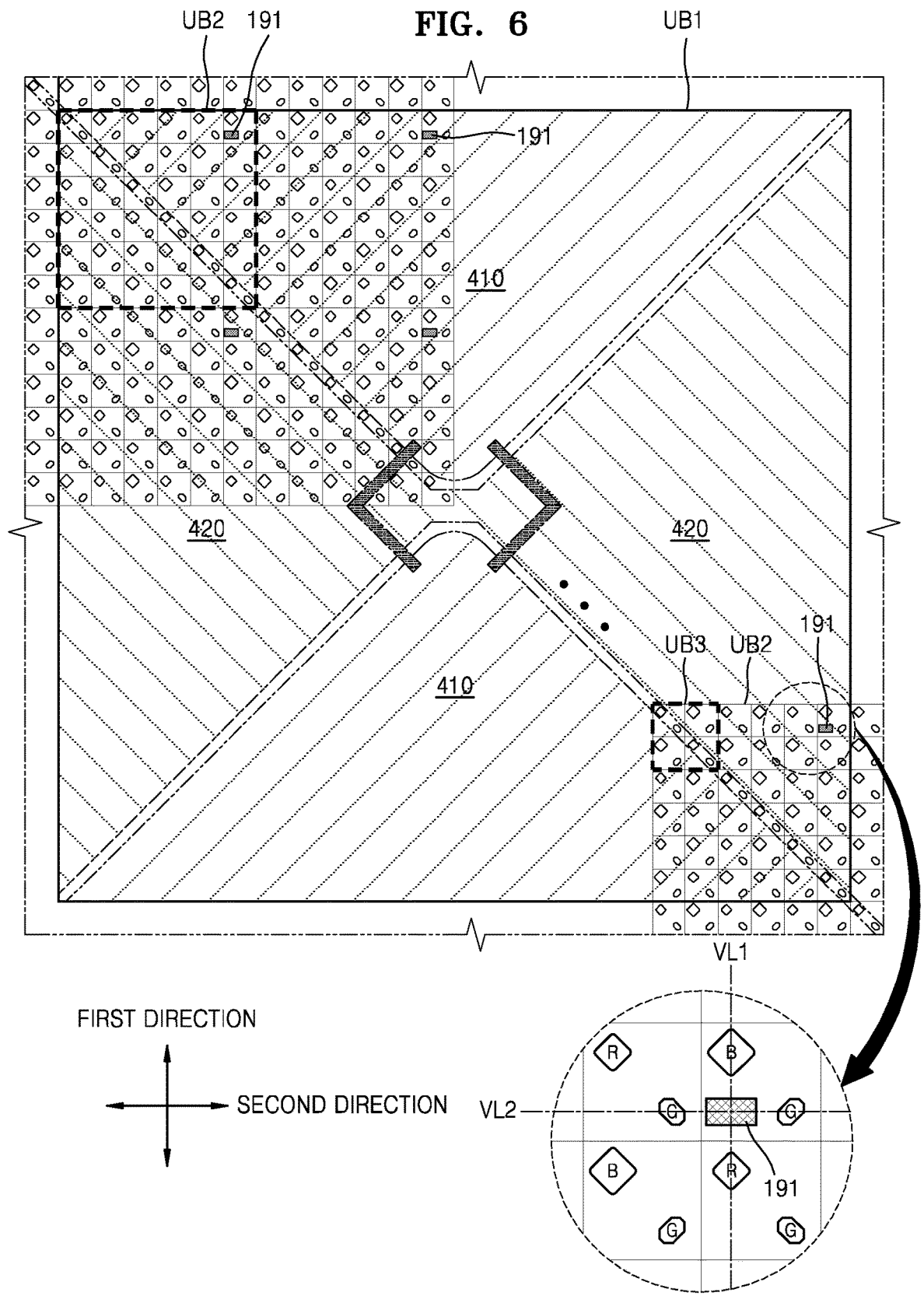
FIG. 6 is a plan view of a portion of an organic light emitting display according to an exemplary embodiment of the present inventive concept.
Figure 7:
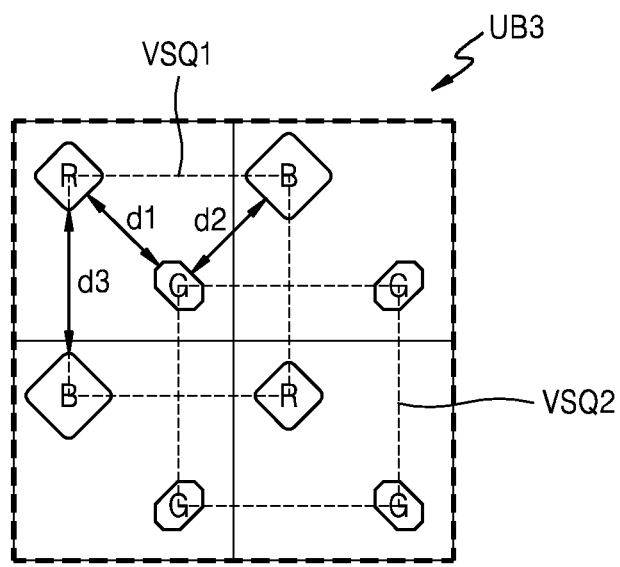
FIG. 7 is a plan view of one pixel pattern unit block excerpted from FIG. 6.
Figure 7:
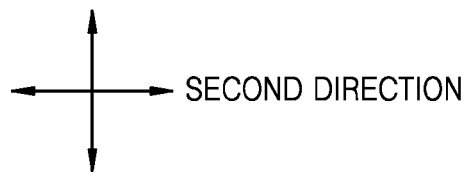

FIG. 6 is a plan view of a portion of the organic light emitting display device 10 according to an exemplary embodiment of the present inventive concept and illustrates an arrangement of the first and second touch electrodes 410 and 420, the spacers 191, and first, second, and third pixels R, G, and B. FIG. 7 is a plan view of one pixel pattern unit block excerpted from FIG. 6.

As shown in FIG. 6, the spacers 191 and the first, second, and third pixels R, B, and G included in the organic light emitting display device 10 may be arranged by a certain rule.

An arrangement of the spacers 191 included in the organic light emitting display device 10 will be described below.

The spacers 191 of the organic light emitting display device include a plurality of spacer pattern unit blocks UB2 repeatedly arranged. The spacers 191 may be formed in a repetitive arrangement of spacer pattern unit blocks UB2. The spacer pattern unit block UB2 may be a virtual unit block having a certain area including at least one spacer 191 and may be understood as a minimum repetitive unit of the arrangement pattern of the spacers 191 included in the organic light emitting display device 10.

At least one spacer 191 of the spacer pattern unit block UB2 may be arranged at a particular location in the spacer pattern unit block UB2. FIG. 6 illustrates an embodiment where the spacer pattern unit block UB2 includes one spacer 191 and the one spacer 191 is adjacent to one corner of the spacer pattern unit block UB2.

The spacer 191 may be located between adjacent pixels, as illustrated in the enlarged view of FIG. 6. For example, the spacer 191 may be located at a crossing point of a first virtual line VL1 connecting neighboring first and second pixels R and B, and a second virtual line VL2 connecting neighboring third pixels G. For example, the spacer 191 may be adjacently located between first and second pixels R and B and a pair of third pixels G.

In an embodiment, the spacer pattern unit block UB2 is a virtual unit block having a smaller size than the touch pattern unit block UB1, and each touch pattern unit block UB1 corresponds to the repetitive arrangement of the spacer pattern unit blocks UB2. For example, the arrangement of the spacers 191 of each touch pattern unit block UB1 may be the same as the arrangement of the spacers 191 of the spacer pattern unit blocks UB2 repeatedly arranged, as illustrated in FIG. 6.

For example, when each touch pattern unit block UB1 corresponds to the arrangement of the spacer pattern unit blocks UB2 in an A×B array (A and B are natural numbers), the arrangement pattern of the spacers 191 corresponding to each touch pattern unit block UB1 may correspond to the arrangement pattern of the spacers 191 when the spacer pattern unit blocks UB2 are arranged in the A×B array. In the present specification, "the spacer pattern unit blocks UB2 are arranged in the A×B array" may denote "a matrix array in which a number A of the spacer pattern unit blocks UB2 are arranged in the first direction and a number B of the spacer pattern unit blocks UB2 are arranged in the second direction". When the touch pattern unit block UB1 is a square and the spacer pattern unit block UB2 is a square, the above-described A and B have the same values.

When the arrangement of the spacers 191 corresponding to each touch pattern unit block UB1 does not correspond to the repetitive arrangement of the spacer pattern unit blocks UB2, the arrangements of the spacers 191 of each touch pattern unit block UB1 will be different from each other. For example, an arrangement pattern of the spacers 191 in any one of the neighboring touch pattern unit blocks UB1s may be different from the arrangement pattern of the spacers 191 in the other one of the neighboring touch pattern unit blocks UB1s. A defect inspection of the touch electrode unit 400 (refer to FIG. 2) may be performed by capturing an image for each touch pattern unit block UB1 and comparing the captured images with one another or with a reference image. When the arrangement patterns of the spacers 191 are different in each touch pattern unit block UB1, interference fringes due to the spacers 191 may be different from each other and the images may be distorted. Thus, it may be impossible to detect the defect of the touch electrode unit 400. However, according to an embodiment of the present inventive concept, since the arrangement of the spacers 191 of each touch pattern unit block UB1 corresponds to the repetitive arrangement of the spacer pattern unit blocks UB2 including the spacer 191 at particular location, the arrangement of the spacers 191 may be the same for each touch pattern unit block UB1, and problems due to the interference described above at the defect inspection of the touch electrode unit 400 may be prevented or reduced.

An arrangement of the first, second, and third pixels R, B, and G included in the organic light emitting display device 10 will be described below.

The pixels of the organic light emitting display device 10, for example, the first, second, and third pixels R, B, and G, may be formed in a repetitive arrangement of certain pixel pattern unit blocks UB3s. The pixel pattern unit block UB3 may be a virtual unit block having a certain area including the first pixel R, the second pixel B, and the third pixel G. It may be understood that the pixel pattern unit block UB3 corresponds to the minimum repetitive unit of the arrangement pattern of pixels included in the organic light emitting display device 10. In an embodiment, the pixel pattern unit block UB3 has a square shape.

In an embodiment, the pixel pattern unit block UB3 includes the first, second, and third pixels R, B, and G, and the sum of the numbers of the first and second pixels R and B is the same as the number of the third pixels G. FIGS. 6 and 7 illustrate the pixel pattern unit block UB3 including two first pixels R, two second pixels B, and four third pixels G.

The first, second, and third pixels R, B, and G may be at particular locations in the pixel pattern unit block UB3. As illustrated in FIG. 7, the first pixel R and the second pixel B may be respectively placed at vertices of a first virtual rectangle VSQ1 having one of the third pixels G as a center point. For example, the first pixels R may be respectively located at opposite vertices of a first virtual rectangle VSQ1 with the third pixel G therebetween in a diagonal direction. The second pixels B may be respectively located at opposite vertices of the first virtual rectangle VSQ1 with the third pixel G therebetween in the diagonal direction. The third pixels G may be respectively located at opposite vertices of the second virtual rectangle VSQ2 centering on a pixel (the first pixel or the second pixel) at any one vertex of the first virtual rectangle VSQ1.

In an embodiment, the size of the first virtual rectangle VSQ1 is the same as that of the second virtual rectangle VSQ2. Accordingly, the distances (the shortest distances) between the neighboring first and second pixels R and B in the first and second directions may be equal to each other, and the distances (the shortest distances) between the neighboring third pixels G in the first and second directions may be equal to each other. In an embodiment, a shortest distance d1 between the first pixel R and the third pixel G, and a shortest distance d2 between the second pixel B and the third pixel G are equal to each other, but smaller than a shortest distance d3 between the first pixel R and the second pixel B.

In an embodiment, the pixel pattern unit block UB3 is a virtual unit block having a smaller size than the touch pattern unit block UB1, and each touch pattern unit block UB1 may correspond to the repetitive arrangement of the pixel pattern unit block UB3. For example, the arrangement of the pixels corresponding to each touch pattern unit block UB1 may correspond to the repetitive arrangement of the pixel pattern unit blocks UB3s as illustrated in FIG. 6.

In an embodiment, the size (area) of each touch pattern unit block UB1 corresponds to the size (area) of a set of pixel pattern unit blocks UB3s arranged in an M×N array (M and N are natural numbers), and the arrangement pattern of the pixels of each touch pattern unit block UB1 correspond to the arrangement pattern of the pixels when the pixel pattern unit blocks UB3s are arranged in the M×N array (M and N may be the same numbers or different numbers).

In an embodiment, the pixel pattern unit block UB3 is a virtual unit block having a smaller size than the spacer pattern unit block UB2. Each spacer pattern unit block UB2 may correspond to the repetitive arrangement of the pixel pattern unit blocks UB3s. For example, the arrangement of the pixels of each spacer pattern unit block UB2 may correspond to the repetitive arrangement of the pixel pattern unit blocks UB3s.

In an embodiment, the size (area) of each spacer pattern unit block UB2 corresponds to the size (area) of a set of pixel pattern unit blocks UB3s arranged in a K×L array (K and L are natural numbers). In this case, the arrangement pattern of the pixels of each spacer pattern unit block UB2 may correspond to the arrangement pattern of the pixels when the pixel pattern unit blocks UB3s are arranged in the K×L array (K and L are natural numbers, and K and L may be the same numbers or different numbers). In FIG. 6, each spacer pattern unit block UB2 is illustrated as corresponding to a 3×3 array of the pixel pattern unit block UB3, as an example.

From an aspect of the arrangement of the spacers 191, the touch pattern unit block UB1 may correspond to the repetitive arrangement of the spacer pattern unit blocks UB2 as described above. In an embodiment, when the touch pattern unit block UB1 and the spacer pattern unit block UB2 are respectively squares, the arrangement of the spacers 191 in each touch pattern unit block UB1 may correspond to arrangement of the spacers 191 in the spacer pattern unit blocks UB2 when the spacer pattern unit blocks UB2 are arranged in, for example, an array of 15×15, or 20×20, or the like.

Similarly, from an aspect of pixel arrangement, the touch pattern unit block UB1 and the spacer pattern unit block UB2 may correspond to the repetitive arrangement of the pixel pattern unit blocks UB3s. In an embodiment, when each spacer pattern unit block UB2 corresponds to a 3×3 array of the pixel pattern unit blocks UB3s and each touch pattern unit block UB1 corresponds to a 15×15 array of the spacer pattern unit blocks UB2, the arrangement of the pixels of each touch pattern unit block UB1 may correspond to the arrangement of the pixels when the pixel pattern unit blocks UB3s are arranged in a 45×45 array.

Figure 8:
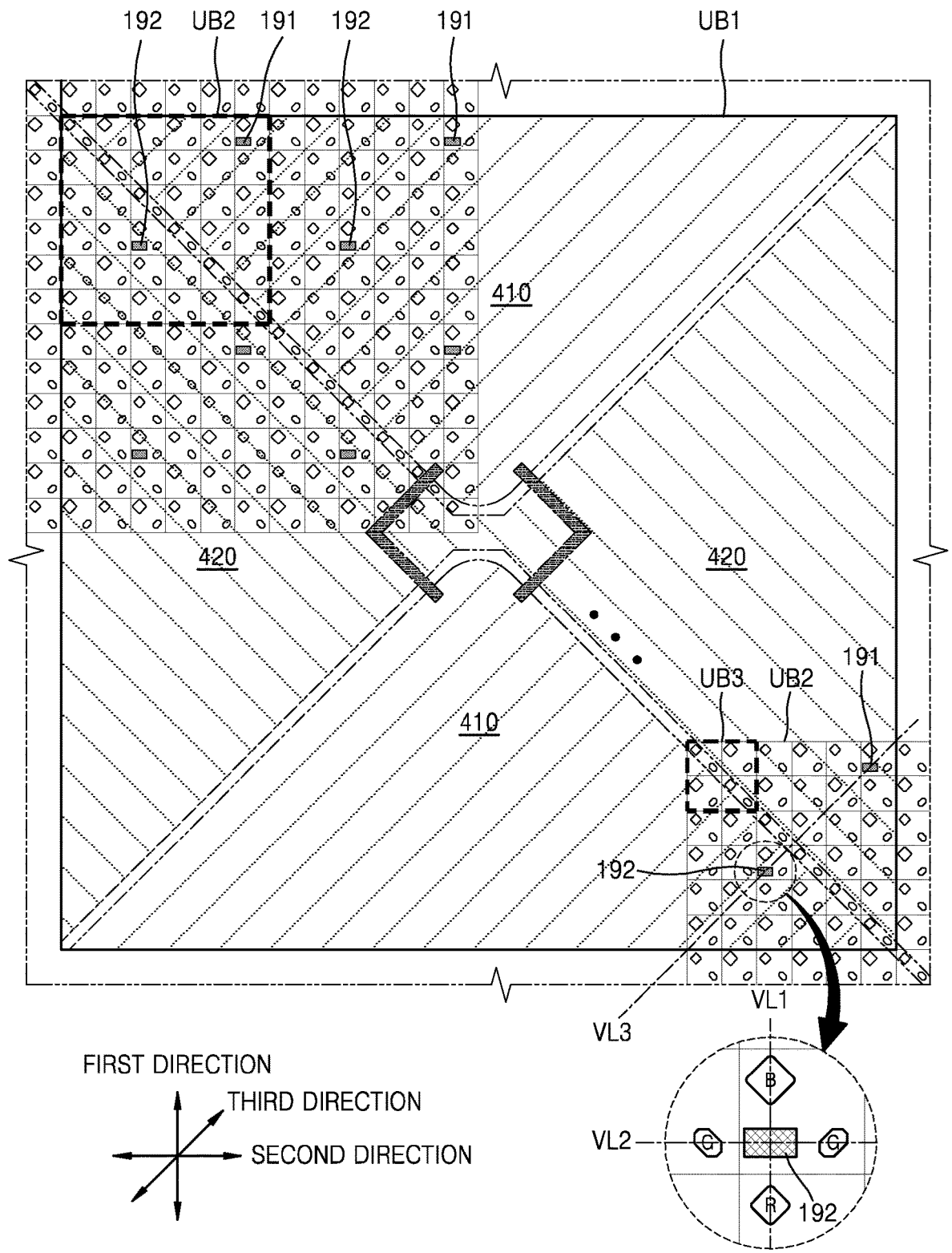
FIG. 8 is a plan view of a portion of an organic light emitting display device according to an exemplary embodiment of the present inventive concept.

FIG. 8 is a plan view of a portion of the organic light emitting display device according to another exemplary embodiment of the present inventive concept, and illustrates arrangements of the first and second touch electrodes 410 and 420, the first and second spacers 191 and 192, and the first, second, and third pixels R, B, and G. Since a configuration of the touch pattern unit block UB1 of FIG. 8 is similar to that described above with reference to FIGS. 6 and 7, differences will be mainly described below.

Referring to FIG. 8, the spacer pattern unit block UB2 may include a plurality of spacers, for example, a first spacer 191 and a second spacer 192.

The first spacer 191 may be placed adjacent to one corner of the spacer pattern unit block UB2 as described above with reference to FIG. 6. In an embodiment, the second spacer 192 is spaced apart from the first spacers 191 by a certain distance. For example, the first spacer 191 and the second spacer 192 may be spaced apart from each other along a third virtual line VL3 extending in a third direction. The second spacer 192 may be placed adjacent to other corner of the spacer pattern unit block UB2 in the third direction. The third direction may be in an acute angle with respect to the first direction and the second direction, and may correspond to a diagonal direction of the spacer pattern unit block UB2.

Referring to an enlarged view in FIG. 8, the second spacer 192, like the first spacer 191, is placed at a point where the first virtual line VL1 connecting the neighboring first and second pixels R and B, and the second virtual line VL2 connecting the neighboring third pixels G cross each other.

Figure 9:
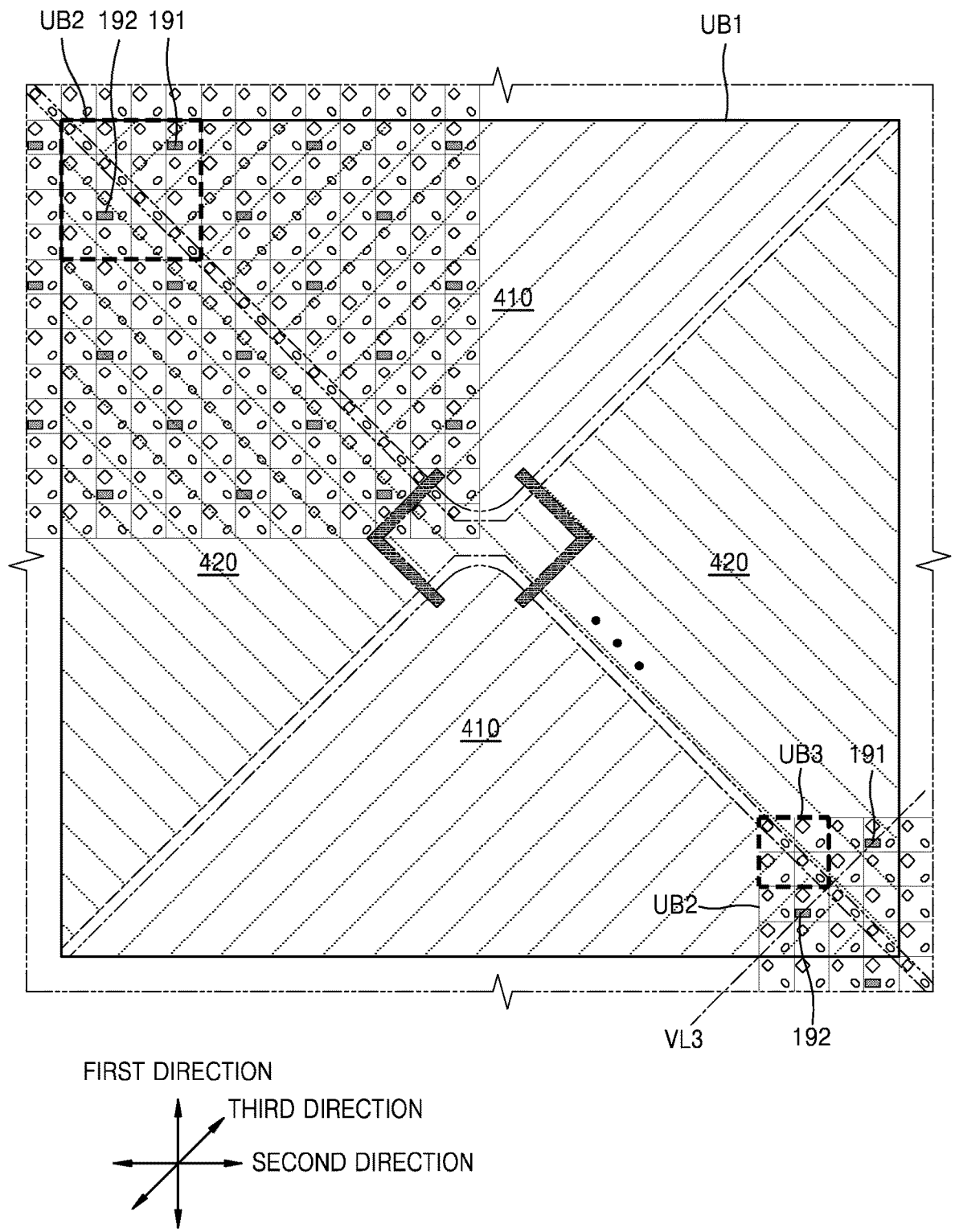
FIG. 9 is a plan view of a portion of an organic light emitting display device according to an exemplary embodiment of the present inventive concept.

FIG. 9 is a plan view of a portion of the organic light emitting display device according to another exemplary embodiment of the present inventive concept, and illustrates arrangements of the first and second touch electrodes 410 and 420, the first and second spacers 191 and 192, and the first, second, and third pixels R, B, and G. Since a configuration of the touch pattern unit block UB1 of FIG. 9 is similar to that described above with reference to FIGS. 6 and 7, differences will be mainly described below.

The pixel arrangement of the spacer pattern unit block UB2 may include the repetitive arrangement of the pixel pattern unit blocks UB3s. For example, the pixel arrangement of the spacer pattern unit block UB2 may correspond to that of a 2×2 array of the pixel pattern unit blocks UB3s as illustrated in FIG. 9. The first and second spacers 191 and 192 may be arranged in each spacer pattern unit block UB2, and the first and second spacers 191 and 192 may be arranged along the third virtual line VL3 in the third direction as described above with reference to FIG. 8.

Figure 10:
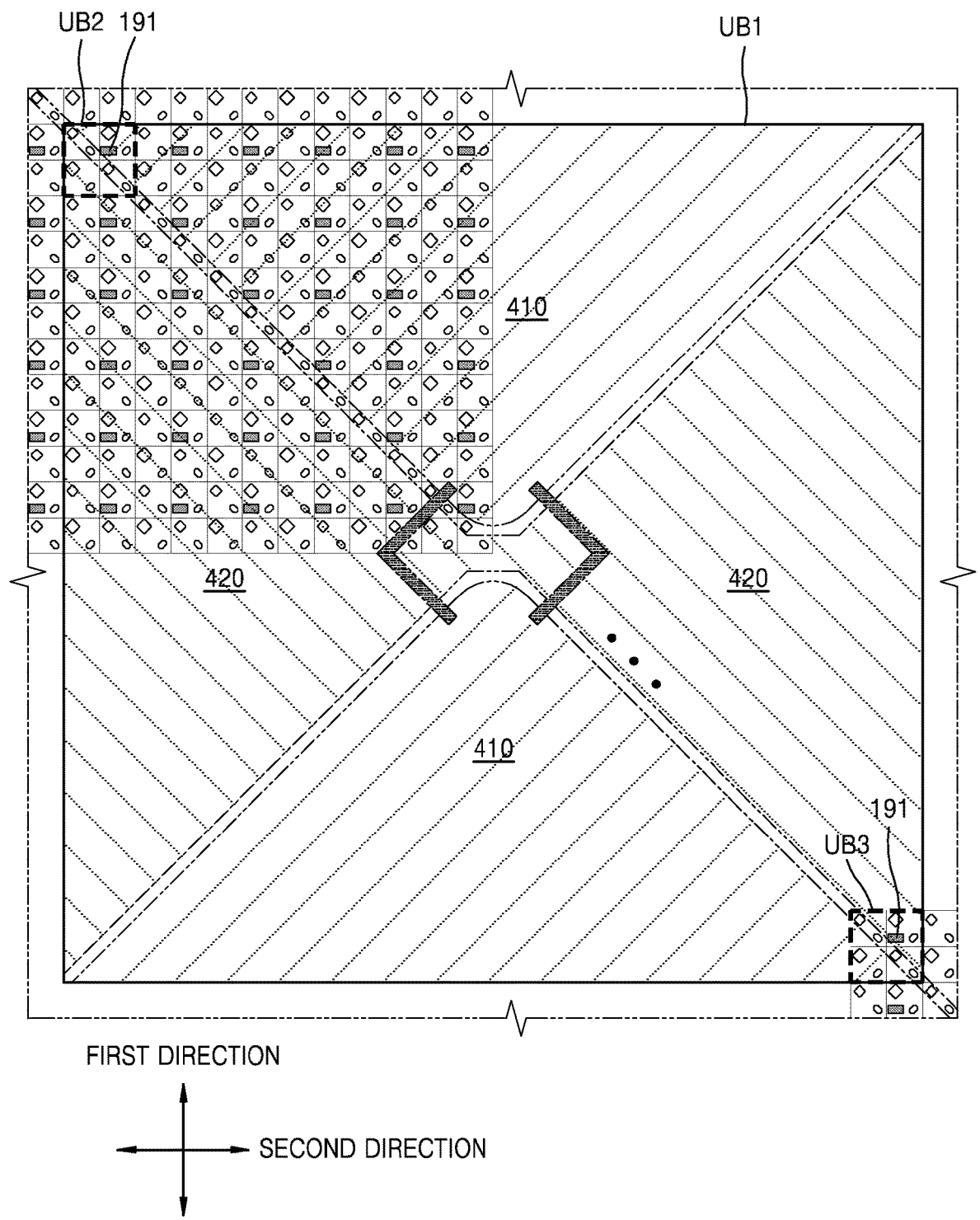
FIG. 10 is a plan view of a portion of an organic light emitting display device according to an exemplary embodiment of the present inventive concept.

FIG. 10 is a plan view of a portion of the organic light emitting display device according to an exemplary embodiment of the present inventive concept, and illustrates arrangements of the first and second touch electrodes, spacers, and pixels. Since a configuration of the touch pattern unit block UB1 of FIG. 10 is similar to that described above with reference to FIGS. 6 and 7, differences will be mainly described below.

Referring to FIG. 10, the spacer pattern unit block UB2 is smaller than the touch electrode unit block UB1, but is the same size as the pixel pattern unit block UB3. For example, the spacer pattern unit block UB2 and the pixel pattern unit block UB3 may be substantially the same unit blocks.

Figure 11:
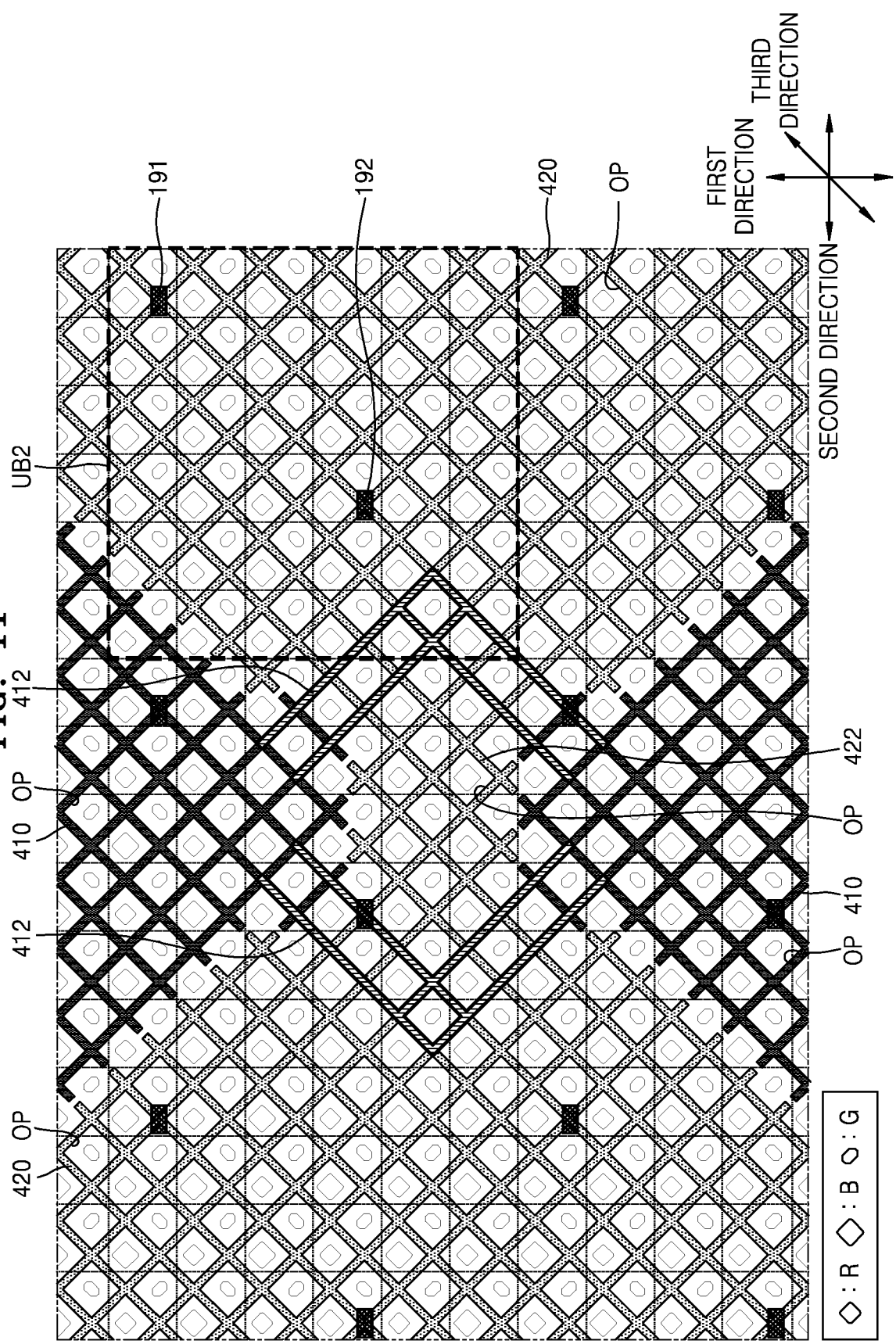
FIG. 11 is a plan view of a portion of a touch pattern unit block according to an exemplary embodiment of the present inventive concept.

FIG. 11 is a plan view of a portion of the touch pattern unit block UB1 according to an exemplary embodiment of the present inventive concept. FIG. 11 may be understood as an enlarged view of a portion where the first touch electrode 410 and the second touch electrode 420 intersect each other in FIG. 8.

Referring to FIG. 11, the first and second spacers 191 and 192 are located between the first, second, and third pixels R, B, and G. The spacer arrangement of the organic light emitting display device may correspond to the repetitive arrangement of the spacer pattern unit blocks UB2 including the first and second spacers 191 and 192 which are spaced apart from each other in the third direction. The pixel arrangement of the organic light emitting display device may correspond to the repetitive arrangement of the pixel pattern unit blocks UB3s described above with reference to FIG. 7.

The first touch electrodes 410 are spaced apart from each other in the first direction and are electrically connected to each other via the first connection line 412. The second touch electrodes 420 are arranged in the second direction and are electrically connected to each other via the second connection line 212 between the neighboring second touch electrodes 420. The first connection line 412 may be placed on the first touch electrodes 410 with an insulating layer therebetween, and may electrically connect the first touch electrodes 410 via contact holes passing through the insulation layer. The second connection line 422 may be placed on a same layer as the second touch electrodes 420 and electrically connect the second touch electrodes 420 as described above.

In an embodiment, each of the first and second touch electrodes 410 and 420 include wires formed to at least partially surround the first through third pixels R, B, and G. The wires may have a net structure in which they are connected to each other but do not overlap the first through third pixels R, B, and G. The wires of each of the first and second touch electrodes 410 and 420 may at least partially surround each pixel.

In an embodiment, the wires of a first touch electrode 410 includes first wires that are parallel to one another that are connected to one another via second wires that are parallel to one another and perpendicular to the first wires. In an embodiment, the wires of a second touch electrode 420 include third wires that are parallel to one another that are connected to one another via fourth wires that are parallel to one another and perpendicular to the third wires. In an embodiment, the first wires are perpendicular to the third wires. In an embodiment, a first connection line 412 has an L shape (or a V shape) that connects the wires of a pair of first touch electrodes 410 together. In an embodiment, the L shape (or V shape) overlaps a portion of a second touch electrode 420. In an embodiment, the pair of first touch electrodes 410 are connected together via a pair of the L shaped (or V shaped) connection lines, and the pair of second touch electrodes 420 are connected together via the second connection line 422. In an embodiment, the first L shape (or V shape) of the pair of L shapes overlaps a portion of a second touch electrode 420 of the pair of second touch electrodes 420 and the second L shape (or V shape) of the pair of L shapes (or V shapes) overlaps a portion of another adjacent second touch electrode 420 of the pair of electrodes 420.

Although the first and second touch electrodes 410 and 420 include transparent electrodes such as ITO, the transmittance may be less than about 100%. Thus, when the first, second, and third pixels R, B, and G overlap the wires of the first and second touch electrodes 410 and 420, intensity of light of the red color, blue color, and green color, respectively emitted from the first, second, and third pixels R, B, and G may be reduced while the light passes through the wires. However, according to an embodiment of the present inventive concept, each of the first and second touch electrodes 410 and 420 have openings OP corresponding to the first, second, and third pixels R, B and G, and are formed in a net structure which at least partially surrounds the first, second, and third pixels R, B, and G. Thus, a problem of reduction in luminous efficiency due to the first and second touch electrodes 410 and 420 may be prevented.

The first and second connection lines 412 and 422 may have the same structure as the first and second touch electrodes 410 and 420. For example, each of the first and second connection lines 412 and 422 may have a net structure which at least partially surrounds each of the first, second, and third pixels R, B, and G, and may include openings OP exposing the first, second, and third pixels R, B, and G.

As described above, the first and second touch electrodes 410 and 420, and the first and second connection lines 412 and 422 may have a wire structure which at least partially surrounds the first, second, and third pixels R, B and G. Thus, the wires, and the first and second spacers 191 and 192 may overlap each other in a non-pixel area.

As described above, the first and second touch electrodes 410 and 420 may include transparent electrodes such as ITO. However, the inventive concept is not limited thereto. In another embodiment of the inventive concept, the first and second touch electrodes 410 and 420, and the first and second connection lines 412 and 422 include metal such as Ti, and/or Al.

Even when the organic light emitting display device as a display device having flexibility is bent or curled around a certain axis as the center, since the first and second touch electrodes 410 and 420 have the net structure as described above, broken or damaged wires may be prevented or reduced.

While one or more embodiments of the inventive concept have been described with reference to the figures, it will be understood by those of ordinary skill in the art that various changes in form and details may be made therein without departing from the spirit and scope of the inventive concept.

What is claimed is:

1. An organic light emitting display device comprising:
a plurality of pixels arranged in a display area;
a plurality of spacers disposed in the display area and spaced apart from each other; and
a touch electrode unit disposed over the plurality of pixels and the plurality of spacers, the touch electrode unit including first touch electrodes arranged in a first direction and second touch electrodes arranged in a second direction substantially perpendicular to the first direction, each of the first and second touch electrodes comprising meshed lines at least partially surrounding each of the plurality of pixels, wherein:
the touch electrode unit includes a plurality of touch pattern unit blocks repeatedly arranged, and each of the plurality of touch pattern unit blocks includes portions of each of neighboring first touch electrodes and portions of each of neighboring second touch electrodes; and
the plurality of spacers includes a plurality of spacer pattern unit blocks repeatedly arranged, and each of the plurality of spacer pattern unit blocks includes at least one spacer and is smaller than the touch pattern unit block, wherein the plurality of spacer pattern unit blocks includes:
a first spacer pattern unit block including a first spacer that is located at an intersection of meshed lines of one of the first touch electrodes, and
a second spacer pattern unit block including a second spacer that is located at an intersection of meshed lines of one of the second touch electrodes.

2. The organic light emitting display device of claim 1, wherein the plurality of spacers overlaps the meshed lines of the first touch electrodes or the meshed lines of the second touch electrodes.

3. The organic light emitting display device of claim 1, wherein an arrangement of the plurality of spacers corresponding to each of the plurality of touch pattern unit blocks corresponds to an arrangement of the spacers according to an A×B array of the plurality of spacer pattern unit blocks, where A and B are natural numbers.

4. The organic light emitting display device of claim 1, wherein:
the plurality of pixels includes a plurality of pixel pattern unit blocks repeatedly arranged,
each of the plurality of pixel pattern unit blocks includes at least three pixels that emit lights of different colors, and
an arrangement of pixels of each of the plurality of spacer pattern unit blocks corresponds to K of the plurality of pixel pattern unit blocks arranged in the first direction or in the second direction,
where K is a natural number.

5. The organic light emitting display device of claim 1, wherein:
the plurality of pixels includes a plurality of pixel pattern unit blocks repeatedly arranged,
each of the plurality of pixel pattern unit blocks includes at least three pixels that emit lights of different colors, and
an arrangement of the pixels of each touch pattern unit block corresponds to M of the plurality of pixel pattern unit blocks arranged in the first direction or in the second direction,
where M is a natural number.

6. The organic light emitting display device of claim 1, wherein:
the plurality of pixels includes a first pixel configured to emit light having a first color, a second pixel configured to emit light having a second color, and two third pixels configured to emit light having a third color, and
in a plan view, the at least one spacer is located between the first pixel and the second pixel that are adjacent to each other in the first direction and between the two third pixels that are adjacent to each other in the second direction.

7. The organic light emitting display device of claim 1, wherein:
the first spacer pattern unit block further comprises a third spacer spaced apart from the first spacer in a third direction that crosses the first and second directions in a plan view.

8. The organic light emitting display device of claim 1, wherein each of the plurality of touch pattern unit blocks and each of the plurality of spacer pattern unit blocks have a square shape.

9. The organic light emitting display device of claim 1, wherein the plurality of pixels comprises:

the first pixel being adjacent to the first spacer in the first direction and configured to emit light having a first color; and a second pixel and a third pixel arranged in the second direction with the first spacer therebetween, wherein the second pixel is configured to emit light having a second color and the third pixel is configured to emit light having a third color, wherein the first color, the second color, and the third color are different from each other.

10. The organic light emitting display device of claim 9, wherein the first pixel, the second pixel, and the third pixel are respectively located at vertexes of a virtual triangle.

11. The organic light emitting display device of claim 1, wherein the plurality of pixels comprises:

a first column of pixels that extends in the first direction; and a second column of pixels that extends in the first direction, the second column of pixels being adjacent to the first column of pixels along the second direction, wherein one pixel of the second column is between two adjacent pixels of the first column.

12. An organic light emitting display device comprising:
a plurality of pixels arranged in a display area;
a plurality of spacers disposed in the display area and spaced apart from each other; and
a touch electrode unit including a plurality of touch electrode which are disposed over the plurality of pixels and the plurality of spacers, the plurality of touch electrodes including first touch electrodes arranged in a first direction and second touch electrodes arranged in a second direction substantially perpendicular to the first direction, each of the first and second touch electrodes comprising meshed lines at least partially surrounding each of the plurality of pixels, wherein:
the touch electrode unit includes a repeating arrangement structure of a plurality of touch pattern unit blocks, and each of the plurality of touch pattern unit blocks includes portions of each of neighboring first touch electrodes and portions of each of neighboring second touch electrodes; and
the plurality of spacers includes a repeating arrangement structure of a plurality of spacer pattern unit blocks, and each of the plurality of spacer pattern unit blocks is smaller than the touch pattern unit block, wherein the plurality of spacer pattern unit blocks includes:
a first spacer pattern unit block including a first spacer that is located at an intersection of meshed lines of one of the first touch electrodes, and
a second spacer pattern unit block including a second spacer that is located at an intersection of meshed lines of one of the second touch electrodes.

13. The organic light emitting display device of claim 12, wherein:
the first spacer pattern unit block further includes a third spacer spaced apart from the first spacer in the second direction, and the second spacer pattern unit block further includes a fourth spacer spaced apart from the second spacer in the second direction.

14. The organic light emitting display device of claim 13, wherein:
one of the plurality of touch pattern unit blocks comprises the first spacer and a fifth spacer spaced apart from the first spacer in the first direction.

15. The organic light emitting display device of claim 14, wherein:
a number of pixels between the first spacer and the third spacer in the second direction is same as a number of pixels between the first spacer and the fifth spacer in the first direction.

16. The organic light emitting display device of claim 12, wherein:
the plurality of pixels includes a first pixel configured to emit light having a first color, a second pixel configured to emit light having a second color, and two third pixels configured to emit light having a third color, and
in a plan view, the first spacer is located between first pixel and second pixel that are adjacent to each other in the first direction and between the two third pixels that are adjacent to each other in the second direction.

17. The organic light emitting display device of claim 12, wherein the plurality of pixels comprises:
the first pixel configured to emit light having a first color and being adjacent to the first spacer in the first direction; and
a second pixel and a third pixel arranged in the second direction with the first spacer therebetween, wherein the second pixel is configured to emit light having a second color and the third pixel is configured to emit light having a third color, wherein the first color, the second color, and the third color are different from each other.

18. The organic light emitting display device of claim 17, wherein the first pixel, the second pixel, and the third pixel are respectively located at vertexes of a virtual triangle.

19. The organic light emitting display device of claim 12, wherein the plurality of pixels comprises:
a first column of pixels that extends in the first direction; and
a second column of pixels that extends in the first direction, the second column of pixels being adjacent to the first column of pixels along the second direction,
wherein one pixel of the second column is between two adjacent pixels of the first column.

20. The organic light emitting display device of claim 12, wherein an arrangement of the plurality of spacers of one of the plurality of touch pattern unit blocks corresponds to an arrangement of the plurality of spacers according to an A×B array of the spacer pattern unit blocks, where A and B are natural numbers.

* * * * *